United States Patent [19]
Galbi et al.

[11] Patent Number: 5,440,258
[45] Date of Patent: Aug. 8, 1995

[54] OFF-CHIP DRIVER WITH VOLTAGE REGULATED PREDRIVE

[75] Inventors: Duane E. Galbi, Jericho; Russell J. Houghton, Essex Junction; Michael Killian, Burlington; Adam B. Wilson, Colchester, all of Vt.

[73] Assignee: International Business Machines Corporation, Armonk, N.Y.

[21] Appl. No.: 193,317

[22] Filed: Feb. 8, 1994

[51] Int. Cl.[6] .............................................. H03K 3/01
[52] U.S. Cl. ..................... 327/112; 327/541; 327/409; 327/288
[58] Field of Search ............. 307/263, 443, 296.8; 327/111, 170, 541, 262, 276, 288, 379, 396, 409

[56] References Cited

U.S. PATENT DOCUMENTS

| | | | |
|---|---|---|---|
| 4,754,170 | 6/1988 | Toda et al. | 307/443 |
| 4,758,743 | 7/1988 | Dehganpour et al. | 307/443 |
| 4,877,978 | 10/1989 | Platt | 307/473 |
| 4,894,561 | 1/1990 | Nogami | 307/443 |
| 4,906,866 | 3/1990 | Alexander et al. | 307/443 |
| 4,924,120 | 5/1990 | Schenk | 307/542 |
| 4,958,086 | 9/1990 | Wang et al. | 307/296.8 |
| 5,008,568 | 4/1991 | Leung et al. | 307/451 |
| 5,140,191 | 8/1992 | Nogle et al. | 307/475 |
| 5,179,297 | 1/1993 | Hsueh et al. | 307/296.6 |
| 5,216,293 | 6/1993 | Sei et al. | 307/263 |
| 5,221,864 | 6/1993 | Galbi et al. | 307/296.8 |

*Primary Examiner*—Timothy P. Callahan
*Assistant Examiner*—Jung Ho Kim
*Attorney, Agent, or Firm*—Whitham, Curtis, Whitham & McGinn; Mark F. Chadurijian; Adel A. Ahmed

[57] ABSTRACT

An off-chip driver with regulated supplies compensates for power supply fluctuations. The circuit reduces di/dt noise by providing complementary voltage regulators to regulate the high and low supplies to the driver stages such that they see a constant operating voltage regardless of changes in supply voltage, $V_{CC}$. The circuit uses two push-pull stages which charge and discharge the output load capacitance, $C_0$. This regulated voltage to the driver stages reduces di/dt noise and provides a constant overdrive voltage, constant gate slew rate, and constant staging delay over a specified external supply voltage range.

12 Claims, 5 Drawing Sheets

OFF-CHIP DRIVER WITH VOLTAGE REGULATED PREDRIVE

BACKGROUND OF THE INVENTION

1. Field of the Invention

The present invention generally relates to support circuits for semiconductor memory arrays, such dynamic random access memories (DRAMs), and, more particularly, to an off-chip driver (OCD) circuit which implements a voltage regulated pre-drive technique to reduce di/dt noise.

2. Description of the Prior Art

Fast charging and discharging of off-chip output load capacitance causes di/dt noise (inductive/resistance voltage drops) in the connection lead between the external applied voltage $V_{CC}$ and the internal chip voltage $V_{DD}$ and between external ground GND and internal chip ground $V_{SS}$. This di/dt noise can be sufficient to cause circuit malfunction. In the following circuit description, $V_{DD}$ is taken to be substantially equal to $V_{CC}$ and similarly $V_{SS}$ is taken to be substantially equal to GND. An OCD designed to meet delay requirements at low tolerance $V_{CC}$ will cause excessive noise when operated at high tolerance $V_{CC}$ conditions.

Prior attempts to reduce di/dt noise include controlling the gate voltage slew and various configurations which control the turn-on of multiple driver stages. Although these methods provide di/dt control at a given $V_{CC}$ the problem of increased speed and noise as $V_{CC}$ increases still poses a problem.

The general idea of incorporating a voltage regulator at the power supplies of the OCD predrive is shown in U.S. Pat. No. 4,958,086 to Wang et al. More specifically, the approach taken by Wang et al. was to couple a voltage regulator to power supply voltage terminals of an output buffer in order to provide a voltage substantially independent of fluctuations in $V_{CC}$. The voltage regulation is applied only to the last stage of the predriver of the output buffer. While this approach was effective in limiting di/dt noise in the simple output buffer to which it is applied, it is not adequate to more modern high speed integrated circuits (ICs) such as the newer high density DRAM chips.

SUMMARY OF THE INVENTION

It is therefore an object of the present invention to provide an off-chip driver (OCD) circuit in which a voltage regulated pre-drive technique is used to reduce di/dt noise.

According to the invention, there is provided an off-chip driver with regulated supplies to compensate for power supply ($V_{CC}$) fluctuations. The invention reduces di/dt noise by providing complementary voltage regulators to regulate the high and low supplies to the driver stages such that they see a constant operating voltage regardless of changes in $V_{CC}$. The circuit uses pull up and pull down devices which charge and discharge the output load capacitance, $C_0$. This regulated operating voltage to the driver stages reduces di/dt noise and provides a constant overdrive voltage, constant gate slew rate, and constant staging delay over a specified external supply voltage range.

In contrast to the Wang et al. buffer, the subject invention regulates the overdrive of both the pull-up and pull-down transistors. This is important for low voltage interfaces (i.e., 3.3 V and below) where output-low and output-high margins become more symmetric.

The regulated voltages control the gate slew rate of both the OCD pull-up and pull-down transistors in order to control OCD di/dt and thus reduces noise. In addition, the regulated voltages control the delay between OCD stages, and in this way, the staging delay is made to be independent of $V_{CC}$. In addition, the invention provides a regulation voltage which gives a constant overdrive (e.g., 2 V) on the OCD transistors. This causes the OCD performance to be to the first order independent of $V_T$ (threshold voltage) variations.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
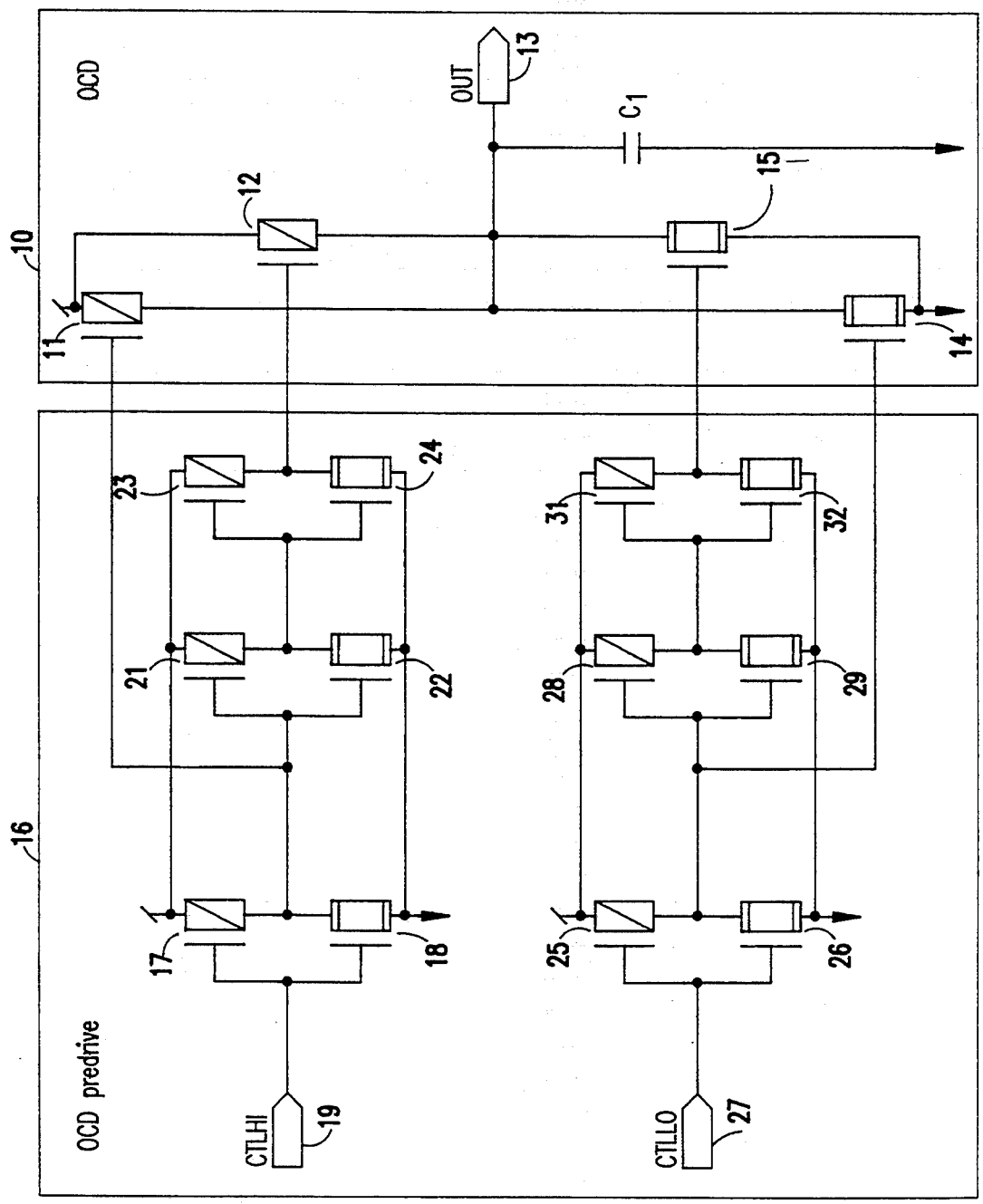
FIG. 1 is a schematic diagram showing a prior art off-chip driver circuit.

Referring now to the drawings, and more particularly to FIG. 1, there is shown a prior art off-chip driver (OCD) circuit 10 for use with a semiconductor memory array, such as a DRAM (dynamic random access memory). The OCD 10 comprises two pull-up stages composed of a pair of P-channel field effect transistors (FETs) 11 and 12 having their sources commonly connected to a source of voltage $V_{DD}$ and their drains commonly connected to output terminal 13. In addition, there are two pull-down stages composed of a second pair of N-channel FETs 14 and 15 having their sources commonly connected to a reference voltage (circuit ground) and their drains commonly connected to output terminal 13. Connected across the output terminal 13 is an output load capacitance $C_1$. The pull-up stages and pull-down stages respectively charge and discharge the output load capacitance $C_1$.

An OCD predrive circuit 16 provides the drive voltages to the gates of FETs 11, 12, 14, and 15. The drive voltages for P-channel FETs 11 and 12 are generated by three pairs of complementary FETs, connected as three cascaded inverters. The first pair, comprising P-channel FET 17 and N-channel FET 18, have their gates connected in common to a first high-control terminal 19, denoted CTLHI. The source of FET 17 is connected to the on-chip voltage source $V_{DD}$, which may or may not be equal $V_{CC}$ due to on-chip resistive voltage drops, and the source of FET 18 is connected to the on-chip circuit ground, $V_{SS}$. The drains of FETs 17 and 18 are connected to the gate of FET 11 and to the gates of a second pair of complementary FETs 21 and 22. The sources of FETs 21 and 22 are respectively connected to the on-chip voltage source $V_{DD}$ and circuit ground $V_{SS}$, and the drains of FETs 21 and 22 are connected in common to the gates of the third pair of complementary FETs 23 and 24. The third pair of complementary FETs 23 and 24 have their sources respectively connected to the on-chip voltage source $V_{DD}$ and circuit ground $V_{SS}$, and their drains are connected in common to the gate of FET 12. The purpose of the inverter pairs 21, 22 and 23, 24 is to provide a delay in the turn on of FET 12 to control the load current build up and, in turn, control inductive drops.

The predrive circuit for the N-channel FETs 14 and 15 is similar to the predrive circuit for the P-channel FETs 11 and 12 and comprises three pairs of complementary FETs, also connected as inverters. The first pair of FETs 25 and 26 have their gates connected to a second low-control terminal 27, denoted CTLLO, and their drains to the gate of FET 15. The second pair of FETs 28 and 29 drive the third pair of FETs 31 and 32 which, in turn, drive the gate of FET 14. The pre-drive stages are responsible for the turn-on timing of the pull-up and pull-down drive stages of OCD 10; that is the OCD FETs 11 and 14 first turn on followed by FETs 12 and 15.

Figure 2:
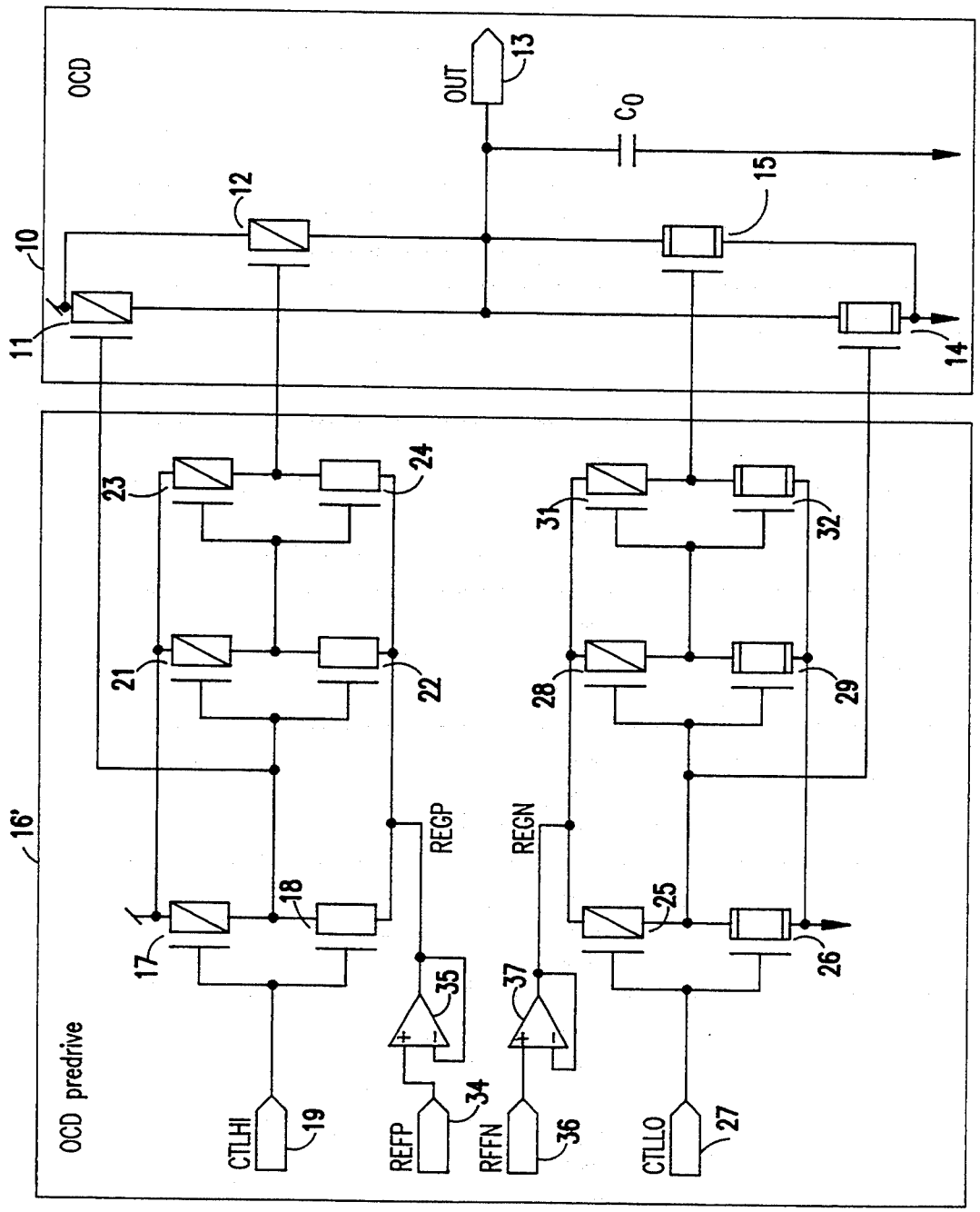
FIG. 2 is a schematic diagram showing the improved off-chip driver circuit according to the invention.

FIG. 2 shows the improvement according to the invention. The OCD circuit 10 is identical to that shown in FIG. 1 and incorporates the same two pull-up stages and two pull-down stages which charge and discharge the output load capacitance $C_0$. The pre-drive stages, however, are modified so that the sources of FETs 18, 22 and 24 are connected to the regulated voltage supply 34, denoted REFP, via a P-REGULATOR buffer 35, and the sources of FETs 25, 28 and 31 are connected to the regulated voltage supply 36, denoted REFN, via a N-REGULATOR buffer 37. The output of buffer amplifier 35 is denoted REGP, and the output of buffer amplifier 37 is denoted REGN.

The current, I, through either pair of the OCD FETs 11, 14 or 12, 15, in the ideal case, is proportional to the square of the difference between the gate to source voltage, $V_{GS}$, and the threshold voltage, $V_T$, of the FETs; i.e.

$$I \propto (V_{GS} - V_T)^2. \quad (1)$$

For a threshold voltage, $V_T$, of say 0.7 V, if $V_{GS}$ is made to equal 2.7 V, then equation (1) becomes $$I \propto (2.7 - 0.7)^2$$

$$I \propto (2)^2$$

so that the current, I, becomes independent of the threshold voltage, $V_T$. The goal then is to provide regulated voltages, REGP and REGN, which are equal, in this example to $V_{DD}-2.7$ V and $V_{SS}+2.7$ V, respectively.

Figure 3:
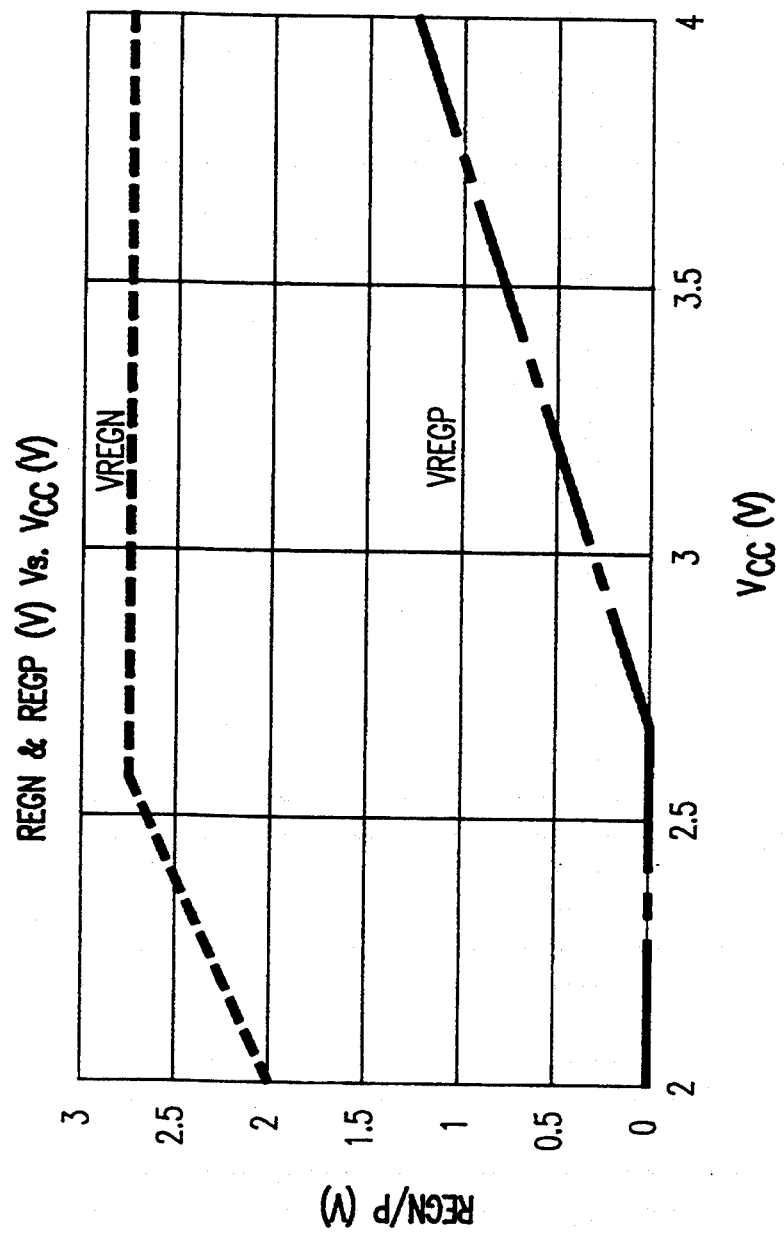
FIG. 3 is a graph showing ideal voltage characteristics of the regulated voltages REGN and REGP.

The ideal voltage characteristics of regulated voltages REGP and REGN are shown in FIG. 3. These are plotted as a function of the supply voltage $V_{CC}$. It will be observed that for $V_{CC}$ greater than approximately 2.6 V, VREGN remains constant at 2.7 V and VREGP increases at the same rate as $V_{CC}$ resulting in a 2.7 V constant difference between $V_{CC}$ and VREGP.

Figure 4:
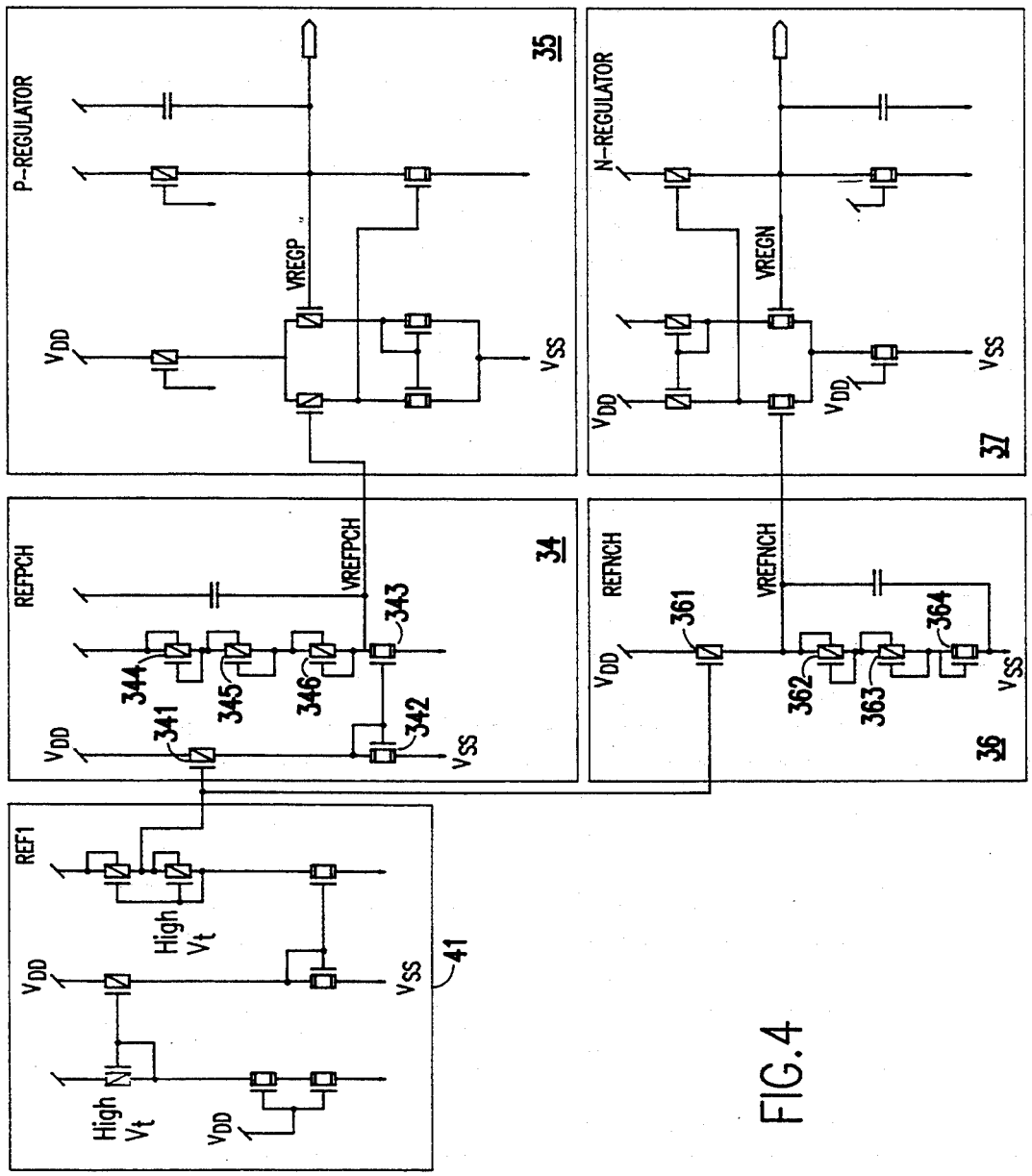
FIG. 4 is a schematic diagram showing the circuitry used to generate the regulated voltages VREGN and VREGP.

The reference/regulator circuits used to generate the regulated voltages REGN and REGP are shown in FIG. 4. A stable voltage reference circuit 41, denoted REF1, creates voltage VREF1 by comparing the thresholds of a regular and a high $V_T$ PFET. For this technology, VREF1 is approximately a constant 1 V below $V_{DD}$. Details of the stable voltage reference circuit 41 are disclosed in U.S. Pat. No. 5,221,864 to Galbi et al., and therefore a detailed explanation is omitted here.

Circuit blocks 34 and 36, denoted REFP and REFN respectively and corresponding to the regulated voltage supplies having the same reference numerals shown in FIG. 2, utilize this voltage to produce respective output reference voltages VREFP and VREFN, where $$V_{REFP} = V_{DD} - 2(V_{DD} - V_{REF1}) - V_{tp} = V_{DD} - 2V - V_{tp},$$

since $(V_{DD} - VREF1) \approx 1$ V, and $$V_{REFN} = V_{SS} + 2(V_{DD} - V_{REF1}) + V_{tn} = +2V + V_{tn},$$

since $V_{SS} \approx 0$ V.

The $V_{tn}$ and $V_{tp}$ components of the reference voltages provide tracking with the OCD device thresholds. The regulator circuits 35 and 37 provide the current necessary to charge and discharge the gate capacitance of all OCD stages connected to the reference nets.

Referring first to the voltage reference 34, the VREF1 voltage from the stable voltage reference circuit 41 is applied to the gate of a P-channel FET 341 having its source connected to $V_{DD}$ and its drain connected to a diode-connected N-channel FET 342 and $V_{SS}$. The gate of FET 342 is connected to the gate of a second N-channel FET 343, forming a current mirror. Connected in series between $V_{DD}$ and the drain of N-channel FET 343 are three diode-connected P-channel FETs 344, 345 and 346. The FETs 341, 344 and 345 are identical, and since the currents through each side of the current mirror is the same, the voltages across FETs 344 and 345 are each 1 V ($V_{DD}-VREF1$). The channel length of FET 346 is equal to that of the OCD P-channel FETs 11 and 12 (shown in FIG. 2), and therefore for our example, the voltage across FET 346 is 0.7 V or $V_{tp}$. Thus, VREFP is equal to $V_{DD}-(1+1+0.7)$V or $V_{DD}-2.7$ V.

Turning next to voltage reference 36, the VREF1 voltage from the stable voltage reference circuit 41 is applied to the gate of a P-channel FET 361 having its source connected to $V_{DD}$ and its drain connected to two diode-connected P-channel FETs 362 and 363. These, in turn, are connected through a diode-connected N-channel FET 364 to $V_{SS}$. The FETs 362 and 363 are identical to FET 361, while the channel length of N-channel FET 364 is equal to that of the OCD N-channel FETs 14 and 15 (shown in FIG. 2), and therefore for our example, the voltage across FET 364 is 0.7 V or $V_{tn}$. Thus, VREFN is equal to $V_{SS}+(1+1+0.7)$V or +2.7 V (since $V_{SS} \approx 0$).

The outputs of circuit blocks 34 and 36 are fed respectively to regulators 35 and 37, denoted P-REGULATOR and N-REGULATOR. These circuits are conventional differential amplifier/current mirror regulators which provide respective output regulated voltages REGP and REGN.

Figure 5A:
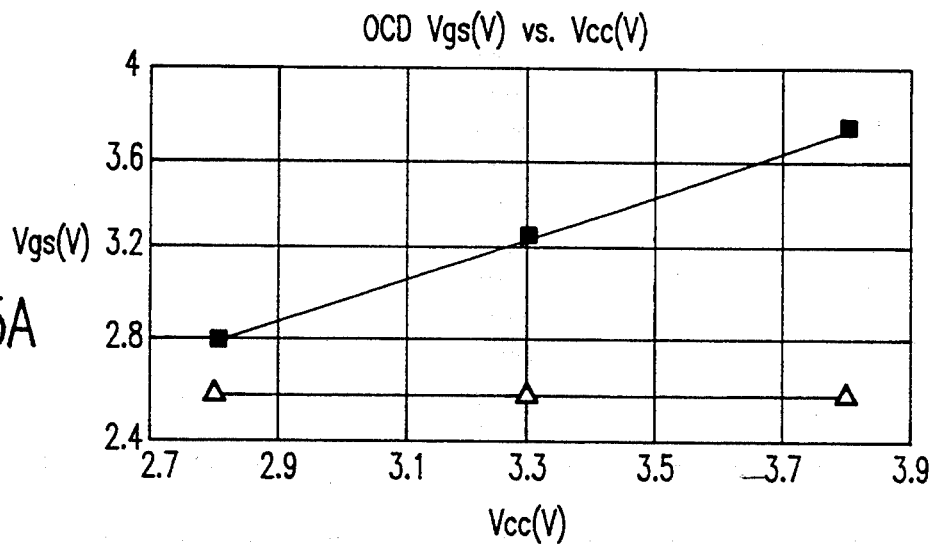
FIGS. 5A, 5B and 5C are, respectively, a graph showing the gate to source voltage, a graph showing the staged timing delay, and a graph showing the gate slew of the invention compared to the prior art.
Figure 5B:
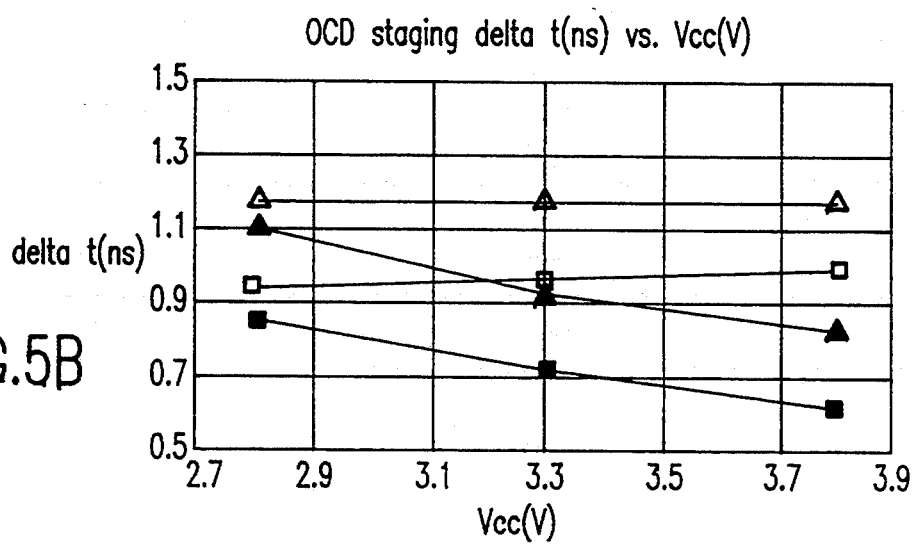
Figure 5C:
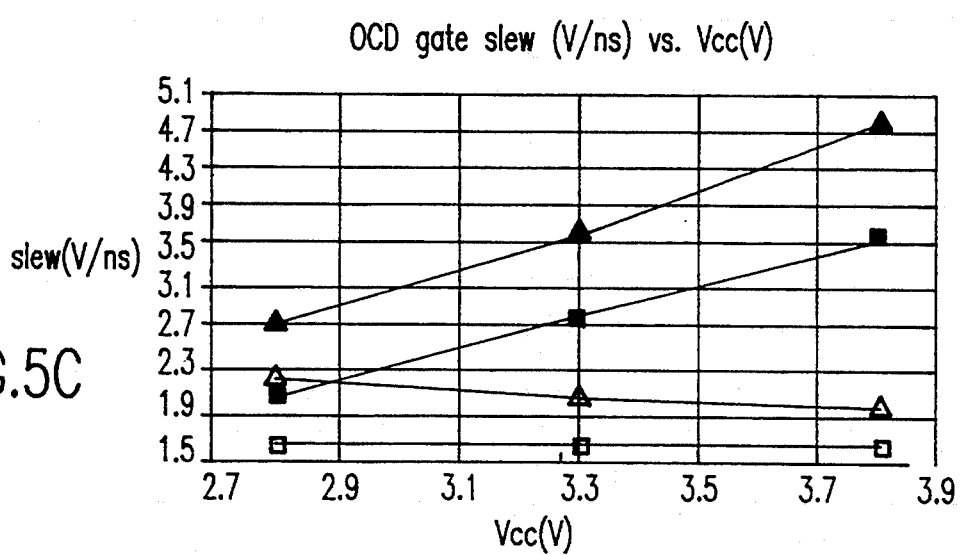

FIGS. 5A, 5B and 5C compare the desired characteristics of the invention shown in FIG. 2 to the prior art circuit shown in FIG. 1. FIG. 5A shows, by solid squares, the variation of gate to source voltage, $V_{GS}$, as a function of $V_{CC}$ of the prior art circuit shown in FIG. 1. In the circuit according to the invention shown in FIG. 2, $V_{GS}$ has been made independent of $V_{CC}$, as shown by the open diamonds of the graph. FIG. 5B shows, by solid squares for the prior art P-channel and by solid triangles for the prior art N-channel FETs of the OCD, the variation of the delay timing in the turn on of the FETs 12 and 15 as a function of $V_{CC}$. In contrast, the open squares and open triangles show that the delay timing in the turn on of the FETs 12 and 15 has been rendered essentially independent of $V_{CC}$. FIG. 5C shows, again by solid squares for the prior art P-channel and by solid triangles for the prior art N-channel FETs of the OCD, the variation of the slew rates as a function of $V_{CC}$. In contrast, the open squares and open triangles show that the slew rates are essentially independent of $V_{CC}$. Thus, it can be seen from these figures that the gate to source voltage, staged timing delay, and gate slew are less dependent on the external supply voltage. This results in minimized di/dt noise and less risk of chip malfunction than possible in the prior art.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An off chip driver for an integrated circuit having an off chip driver threshold voltage comprising:
    an off chip driver circuit having first and second push-pull stages which comprise P-channel and N-channel FETs connected to charge and discharge an output load capacitance;
    first and second driver stages respectively connected to said P-channel and N-channel FETs;
    first and second voltage regulators to regulate high and low voltage supplies to the first and second driver stages such that at an external supply voltage above the off chip driver threshold voltage, the first driver stage is supplied with a voltage that is constant with respect to the external supply voltage and the second driver stage is supplied with a voltage that is constant with respect to ground thereby reducing di/dt noise in said off chip driver; and
    the first and second voltage regulators providing a constant overdrive voltage and constant gate slew rate over a specified external supply voltage range.

2. The off chip driver recited in claim 1 wherein said first and second voltage regulators comprise:
    a stable voltage reference circuit supplying a stable output voltage independent of variations of operating voltage;
    P-channel and N-channel regulated voltage reference circuits each connected to said stable voltage reference circuit and respectively generating voltage references VREFP and VREFN, where VREFP and VREFN are a function of voltage thresholds of the P-channel and N-channel FETs comprising the push-pull driver stages and increase or decrease with a corresponding increase or decrease in the thresholds of the P-channel and N-channel FETs; and
    first and second buffers respectively connected to said P-channel and N-channel regulated voltage reference circuits and supplying the voltages VREFP and VREFN to the first and second driver stages.

3. The off chip driver recited in claim 1 further including delay means for turning on the second push-pull stage a predetermined time period after turn on of the first push-pull stage, the first and second voltage regulators further providing a constant staging delay over a specified external supply voltage range.

4. The off chip driver recited in claim 3 wherein said delay means comprises:
    first and second cascaded inverters connected to receive a first input drive signal supplied to a first P-channel FET of said first push-pull stage and supplying a delayed drive signal to a second P-channel FET of said second push-pull stage, said first voltage regulator supplying VREFP to said first and second cascaded inverters; and
    third and fourth cascaded inverters connected to receive a second input drive signal supplied to a first N-channel FET of said first push-pull stage and supplying a delayed drive signal to a second N-channel FET of said second push-pull stage, said second voltage regulator supplying VREFN to said third and fourth cascaded inverters.

5. The off chip driver recited in claim 4 wherein the first and second input drive signals are supplied by fifth and sixth inverters respectively cascaded with said first and third inverters.

6. An off chip driver for an integrated circuit having an off chip driver threshold voltage comprising:
    an off chip driver circuit having first and second push-pull stages which comprise P-channel and N-channel FETs connected to charge and discharge a load capacitance;
    a pull-up predrive stage and a pull-down predrive stage respectively connected to said P-channel and N-channel FETs;
    a first voltage regulator connected to regulate a low voltage supplied to the pull-up predrive stage;
    a second voltage regulator connected to regulate a high voltage supplied to the pull-down predrive stage, said first and second voltage regulators respectively supplying, at external supply voltage above the off chip driver threshold voltage, said pull-up predrive stage with a voltage that is constant with respect to the external supply voltage and said pull-down predrive stage with a constant operating voltage with respect to ground voltage regardless of changes in the external supply voltage thereby reducing di/dt noise in said off chip driver; and
    and said pull-up and pull-down predrive stages, the first and second voltage regulators providing a constant overdrive voltage, a constant gate slew rate and a constant staging delay over a specified external supply voltage range.

7. The off chip driver recited in claim 6 including delay means for turning on the second push-pull stage a predetermined time period after turn on of the first push-pull stage.

8. The off chip driver recited in claim 6 wherein said first and second voltage regulators comprise:
    a stable voltage reference circuit supplying a stable output voltage independent of variations of operating voltage;
    P-channel and N-channel regulated voltage reference circuits each connected to said stable voltage reference circuit and respectively generating voltage references VREFP and VREFN, where VREFP and VREFN are a function of voltage thresholds of the and P-channel and N-channel FETs comprising the push-pull driver stages increase or decrease with a corresponding increase or decrease in the thresholds of the P-channel and N-channel FET thresholds; and first and second buffers respectively connected to said P-channel and N-channel regulated voltage reference circuits and supplying the voltages VREFP and VREFN to the pull-up and pull-down predrive stages respectively.

9. The off chip driver recited in claim 7 wherein said delay means comprises:

first and second cascaded inverters connected to receive a first input drive signal supplied to a first P-channel FET of said first push-pull stage and supplying a delayed drive signal to a second P-channel FET of said second push-pull stage, said first voltage regulator supplying VREFP to said first and second cascaded inverters; and third and fourth cascaded inverters connected to receive a second input drive signal supplied to a first N-channel FET of said first push-pull stage and supplying a delayed drive signal to a second N-channel FET of said second push-pull stage, said second voltage regulator supplying VREFN to said third and fourth cascaded inverters.

10. An off chip driver for an integrated circuit having an off chip driver threshold voltage comprising:

an off chip driver circuit having first and second push-pull stages which comprise P-channel and N-channel FETs connected to charge and discharge a load capacitance;

a pull-up predrive stage and a pull-down predrive stage respectively connected to said P-channel and N-channel FETs;

a stable voltage reference circuit supplying a stable output voltage independent of variations of operating voltage;

P-channel and N-channel regulated voltage reference circuits each connected to said stable voltage reference circuit and respectively generating voltage references VREFP and VREFN, where VREFP and VREFN are a function of voltage thresholds of the P-channel and N-channel FETs comprising the push-pull driver stages and increase or decrease with a corresponding increase or decrease in the thresholds of the P-channel and N-channel FET thresholds; and first and second buffers respectively connected to said P-channel and N-channel regulated voltage reference circuits and supplying the voltages VREFP and VREFN to the pull-up predrive stage and to the pull-down predrive stage, said first and second buffers respectively supplying, at an external supply voltage above the off chip driver threshold voltages, said pull-up predrive stage with a voltage that is constant with respect to an external supply voltage and said pull-down predrive stage with a constant operating voltage with respect to ground voltage regardless of changes in the external supply voltage thereby reducing di/dt noise in said off chip driver.

11. The off chip driver recited in claim 10 wherein said off chip driver circuit comprises first and second push-pull stages which charge and discharge the output load capacitance and said pull-up and pull-down predrive stages comprise:

first and second inverters respectively supplying first and second drive signals;

third and fourth cascaded inverters connected to supply said first drive signal to a first P-channel FET of said first push-pull stage and to supply a delayed first drive signal to a second P-channel FET of said second push-pull stage, said first voltage regulator supplying VREFP to said first, third and fourth inverters; and fifth and sixth cascaded inverters connected to supply said second drive signal to a first N-channel FET of said first push-pull stage and to supply a delayed second drive signal to a second N-channel FET of said second push-pull stage, said second voltage regulator supplying VREFN to said second, fifth and sixth inverters.

12. The off chip driver recited in claim 2 wherein said first and second buffers are differential amplifiers.

* * * * *